(12) United States Patent
Ellis-Monaghan et al.

(10) Patent No.: US 8,815,671 B2
(45) Date of Patent: Aug. 26, 2014

(54) USE OF CONTACTS TO CREATE DIFFERENTIAL STRESSES ON DEVICES

(75) Inventors: John J. Ellis-Monaghan, Grand Isle, VT (US); Jeffrey P. Gambino, Westford, VT (US); Kirk D. Peterson, Jericho, VT (US); Jed H. Rankin, Richmond, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/892,474

(22) Filed: Sep. 28, 2010

(65) Prior Publication Data
US 2012/0074502 A1    Mar. 29, 2012

(51) Int. Cl.
*H01L 21/8238* (2006.01)

(52) U.S. Cl.
USPC ........... 438/199; 438/300; 438/622; 257/369; 257/E29.121; 257/E21.507; 257/E21.632; 257/E21.641

(58) Field of Classification Search
None
See application file for complete search history.

(56) References Cited

U.S. PATENT DOCUMENTS

| | | | |
|---|---|---|---|
| 6,034,419 A | 3/2000 | Nicholls et al. | |
| 6,437,376 B1 | 8/2002 | Ozkan | |
| 6,780,769 B2 | 8/2004 | Fujisawa et al. | |
| 6,943,391 B2 | 9/2005 | Chi et al. | |
| 7,199,019 B2 | 4/2007 | Park et al. | |
| 7,276,406 B2 | 10/2007 | Chen et al. | |
| 7,279,406 B2 | 10/2007 | Koontz | |
| 7,405,131 B2 | 7/2008 | Chong et al. | |
| 7,407,888 B2 | 8/2008 | Ito et al. | |
| 7,465,664 B2 | 12/2008 | Ho et al. | |
| 7,531,401 B2 | 5/2009 | Baiocco et al. | |
| 2006/0131662 A1* | 6/2006 | Yamada et al. | 257/374 |
| 2006/0220113 A1* | 10/2006 | Tamura et al. | 257/335 |
| 2007/0184600 A1 | 8/2007 | Zhang et al. | |
| 2007/0281432 A1 | 12/2007 | Goldbach et al. | |
| 2008/0020533 A1 | 1/2008 | Thei et al. | |
| 2008/0020591 A1* | 1/2008 | Balseanu et al. | 438/761 |
| 2008/0023772 A1 | 1/2008 | Kawakita | |
| 2008/0157224 A1* | 7/2008 | Fischer et al. | 257/401 |
| 2010/0047978 A1 | 2/2010 | Tamura | |

OTHER PUBLICATIONS

Cruz, U.S. Appl. No. 12/892,465, Office Action Communication, Apr. 2, 2012, 17 pages.

(Continued)

*Primary Examiner* — Benjamin Sandvik
*Assistant Examiner* — Leslie Pilar Cruz
(74) *Attorney, Agent, or Firm* — Richard M. Kotulak; Hoffman Warnick LLC

(57) ABSTRACT

Disclosed herein are various methods and structures using contacts to create differential stresses on devices in an integrated circuit (IC) chip. An IC chip is disclosed having a p-type field effect transistor (PFET) and an n-type field effect transistor (NFET). One embodiment of this invention includes creating this differential stress by varying the deposition conditions for forming PFET and NFET contacts, for example, the temperature at which the fill materials are deposited, and the rate at which the fill materials are deposited. In another embodiment, the differential stress is created by filling the contacts with differing materials that will impart differential stress due to differing coefficient of thermal expansions. In another embodiment, the differential stress is created by including a silicide layer within the NFET contacts and/or the PFET contacts.

18 Claims, 18 Drawing Sheets

(56) References Cited

OTHER PUBLICATIONS

Cruz, Office Action Communication for U.S. Appl. No. 12/892,465 dated Oct. 26, 2012, 14 pages.
Cruz, U.S. Appl. No. 12/892,465, Notice of Allowance & Fees Due, Feb. 4, 2013, 11 pages.
Cruz, Office Action Communication for U.S. Appl. No. 13/798,643 dated Mar. 24, 2014, 13 pages.
Cruz, U.S. Appl. No. 13/798,643, Office Action Communication, Oct. 11, 2013, 21 pages.
Cruz, U.S. Appl. No. 13/851,709, Office Action Communication, Oct. 9, 2013, 21 pages.

* cited by examiner

USE OF CONTACTS TO CREATE DIFFERENTIAL STRESSES ON DEVICES

RELATED APPLICATIONS

This U.S. Patent Application is related to pending U.S. patent application Ser. No. 12/892,465, filed concurrently herewith on Sep. 28, 2010, which is incorporated herein by reference.

FIELD OF THE INVENTION

Embodiments of this invention relate generally to integrated circuit chips and, more particularly, to the use of contacts to create differential stresses on devices in a chip.

BACKGROUND

In order to improve performance of devices, such as field effect transistors (FETs), specifically PFETs (FETs with p-doped channels) and NFETs (FETs with n-doped channels), in integrated circuit (IC) chips, it is desirable to impart a stress on the FETs. Generally, PFETs improve with compressive stress in the channel and NFETs improve with tensile stress. These differential stresses are created by a variety of means, such as growth of SiGe on PFET diffusions, and use of tensile and compressive nitrides on the FETs to tune the stress. This second technique has a shortcoming in that the contacts etched to the FET diffusions reduce this stress, which in turn reduces the carrier mobility and device performance. Solutions to this problem or other ways to impart stress a differential stress on NFETs versus PFETs are desirable.

BRIEF SUMMARY

An integrated circuit (IC) chip is provided that includes at least two devices, e.g., at least one NFET device and at least one PFET device, with differential stresses imparted on the devices. One embodiment of this invention includes creating this differential stress by varying the deposition conditions for forming PFET and NFET contacts, for example, the temperature at which the fill materials are deposited, and the rate at which the fill materials are deposited. In another embodiment, the differential stress is created by filling the contacts with differing materials that will impart differential stress due to differing coefficient of thermal expansions. In another embodiment, the differential stress is created by including a silicide layer within the NFET contacts and/or the PFET contacts.

A first aspect of the disclosure provides a method of creating differential stress in a plurality of contacts in an integrated circuit (IC) chip, the method comprising: providing a substrate including a p-type field effect transistor (PFET) and an n-type field effect transistor (NFET); etching at least one PFET contact trench to the PFET; depositing a first material at a first temperature in the at least one PFET contact trench to form a PFET contact; etching at least one NFET contact trench to the NFET; depositing a second material at a second temperature in the at least one NFET contact trench to form an NFET contact, wherein the first temperature is higher than the second temperature.

A second aspect of the disclosure provides an integrated circuit (IC) chip comprising: a substrate having a p-type field effect transistor (PFET) and an n-type field effect transistor (NFET) thereon; a PFET contact to the PFET; and an NFET contact to the NFET; wherein the PFET contact includes a first material having a first coefficient of thermal expansion (CTE) and the NFET contact includes a second material having a second CTE, where the first CTE is higher than the second CTE.

A third aspect of the disclosure provides an integrated circuit (IC) chip comprising: a substrate having a p-type field effect transistor (PFET) and an n-type field effect transistor (NFET) thereon; a PFET contact to the PFET; an NFET contact to the NFET; and a silicide layer within at least one of: the NFET contact and the PFET contact.

A fourth aspect of the disclosure provides a method of creating differential stress in a plurality of contacts in an integrated circuit (IC) chip, the method comprising: providing a substrate including a p-type field effect transistor (PFET) and an n-type field effect transistor (NFET); and at least one of: etching at least one PFET contact trench to the PFET; depositing a first metal in the at least one PFET contact trench; performing an anneal such that the first metal reacts with the PFET to form a silicide layer within the at least one PFET contact trench; and removing any unreacted metal; and etching at least one NFET contact trench to the NFET; depositing a second metal in the at least one NFET contact trench; performing an anneal such that the second metal reacts with the NFET to form a silicide layer within the at least one NFET contact trench; and removing any unreacted metal These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

Figure 1:
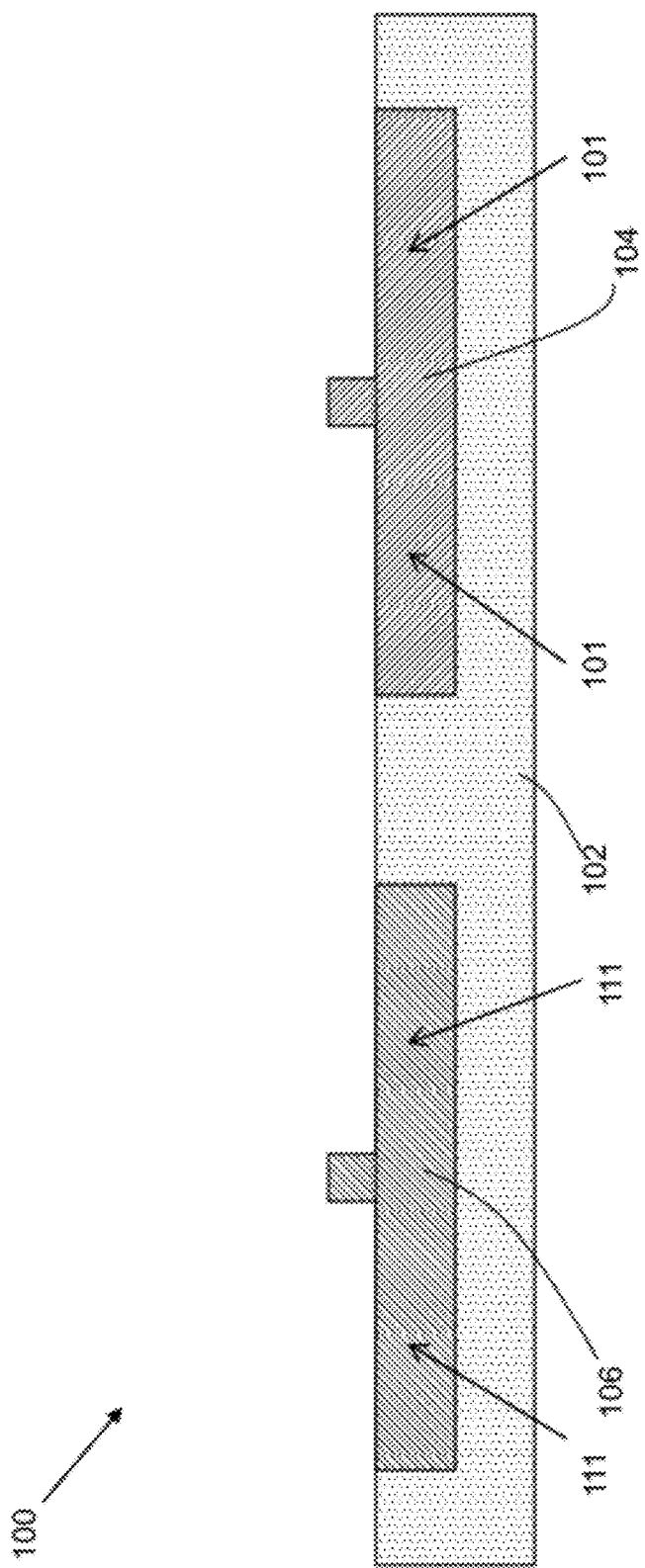
FIGS. 1-7 show steps of a method to form an IC chip according to an embodiment of this disclosure, with FIG. 7 showing the IC chip according to the embodiment.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Figure 5:
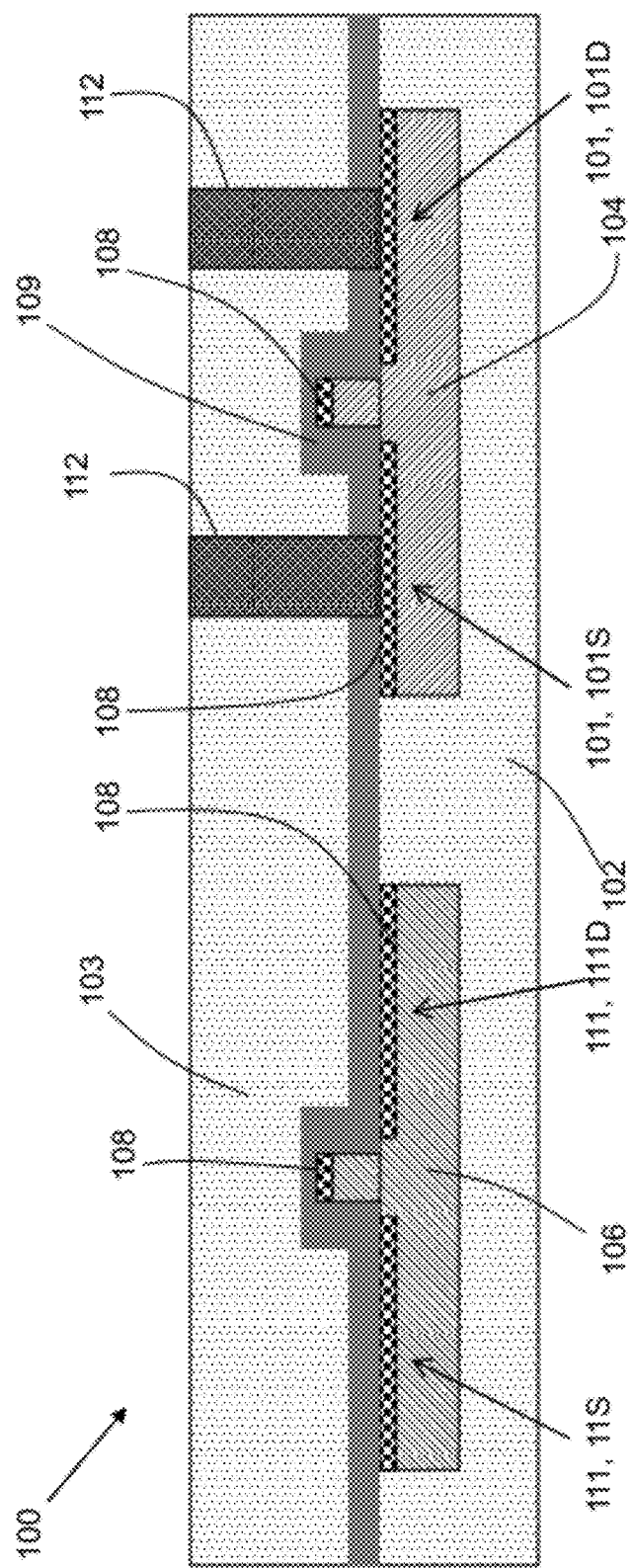
Figure 6:
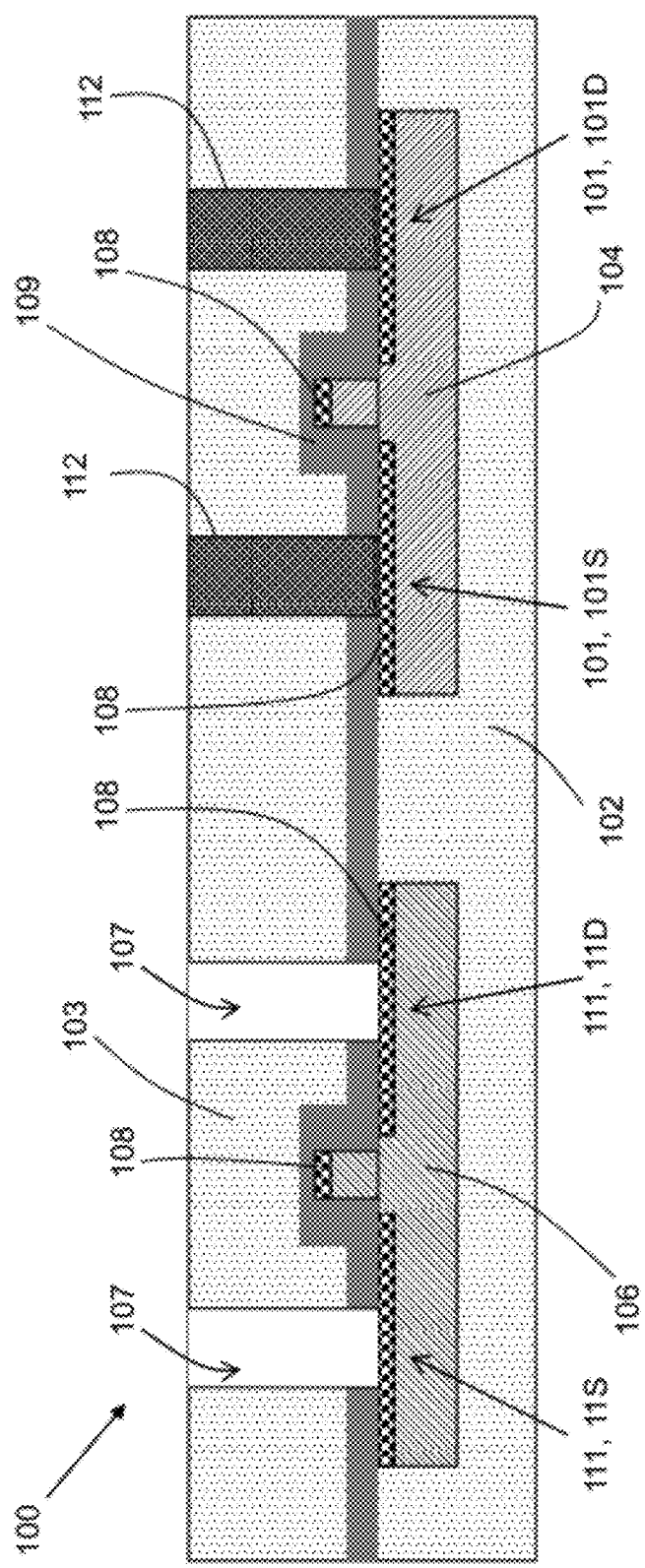
Figure 7:
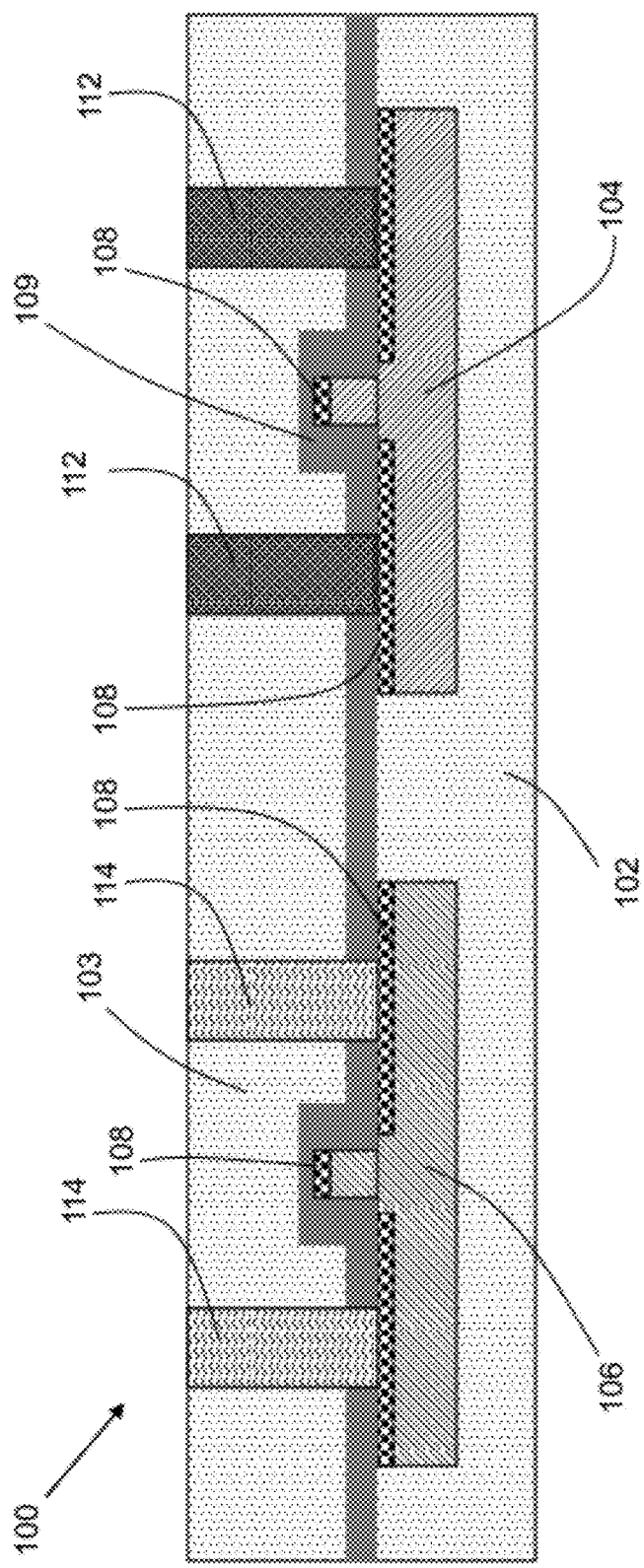

FIGS. 1-7 show cross-sectional views of one embodiment of a method to create differential stress on a plurality of devices in an integrated circuit (IC) chip 100. FIG. 7 shows IC chip 100 formed as a result of the method shown in FIGS. 1-7.

Turning to FIG. 1, a substrate 102 is provided. Substrate 102 can be silicon on insulator (SOI) or can be bulk semiconductor material. Substrate 102 includes at least two field effect transistors (FETs), e.g., at least one p-type field effect transistor (PFET) 104 and at least one n-type field effect transistor (NFET) 106. As understood by one of skill in the art, each FET includes a source/drain region, e.g., source/ drain regions 101 of PFET 104 and source/drain regions 111 of NFET 106. The details of PFET 104 and NFET 106 are not included in the figures because they are not necessary in order to illustrate the embodiments of the invention disclosed herein, however, one of ordinary skill in the art would understand that PFET 104 and NFET 106 include gates, source and drain terminals, and channel regions as known in the art.

Commonly known dopants can be used to dope the channel regions of the FETs to form NFET 106 and PFET 104, for example, for NFET 106, n-type dopants such as phosphorous (P), arsenic (As) or antimony (Sb) can be used, and for PFET 104, p-type dopants, such as boron (B), indium (In) or gallium (Ga) can be used. The transistor gates for devices PFET 104 and NFET 106 can consist of traditional silicon with a silicide or can be another material, such as a metal above the gate oxide.

Figure 2:
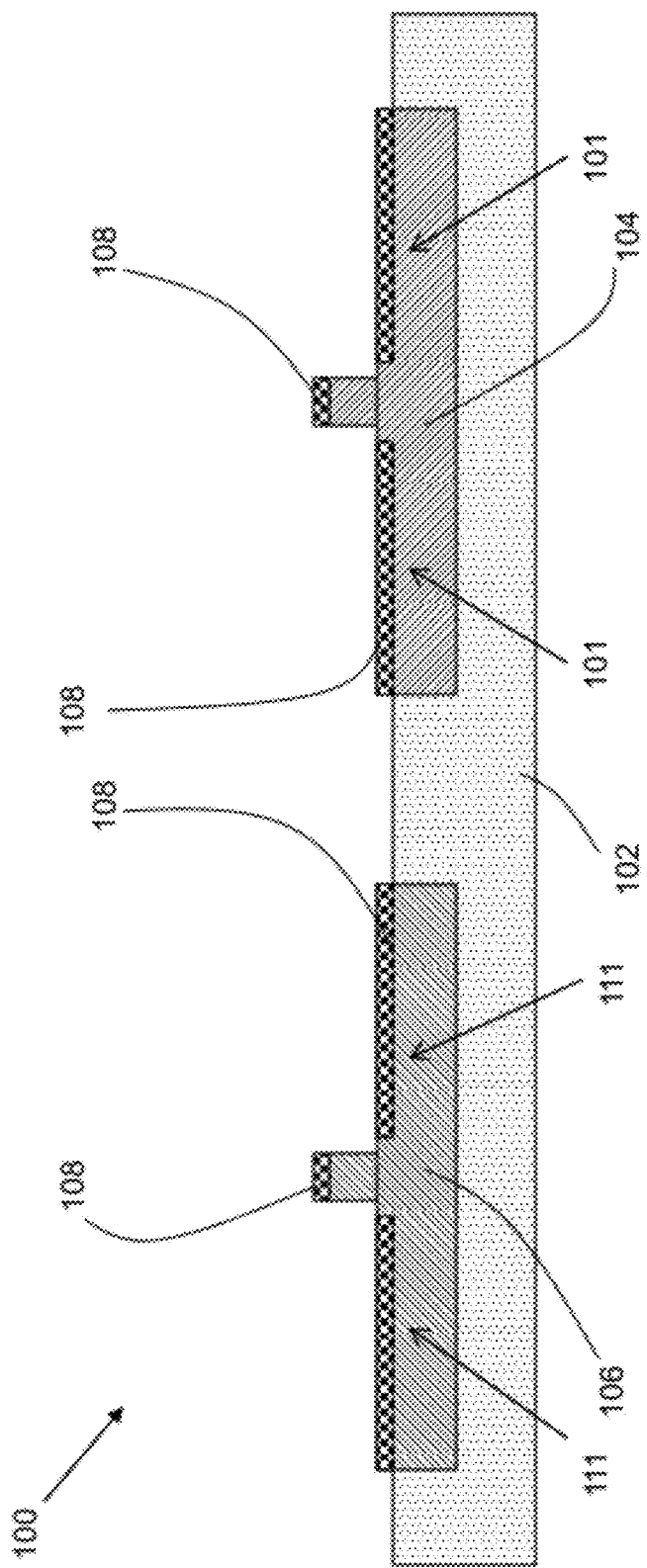

As shown in FIG. 2, a layer of silicide 108 is formed over PFET 104 and NFET 106. Silicide layer 108 may be formed using any now known or later developed technique, e.g., depositing a metal such as titanium, nickel, cobalt, etc., annealing to have the metal react with silicon, and removing unreacted metal. As can be seen in FIG. 2, silicide layer 108 does not typically extend immediately adjacent to the gates of PFET 104 or NFET 106, because spacers and source/drain extensions (not shown) are typically included adjacent to the gates, and the spacers block silicide creation. These spacers and source/drain extensions are not shown in the figures, as it is not necessary for illustrating the embodiments of this invention, but it is understood that the inclusion of spacers and source/drain extensions is commonly known in the art when working with FET devices.

Figure 3:
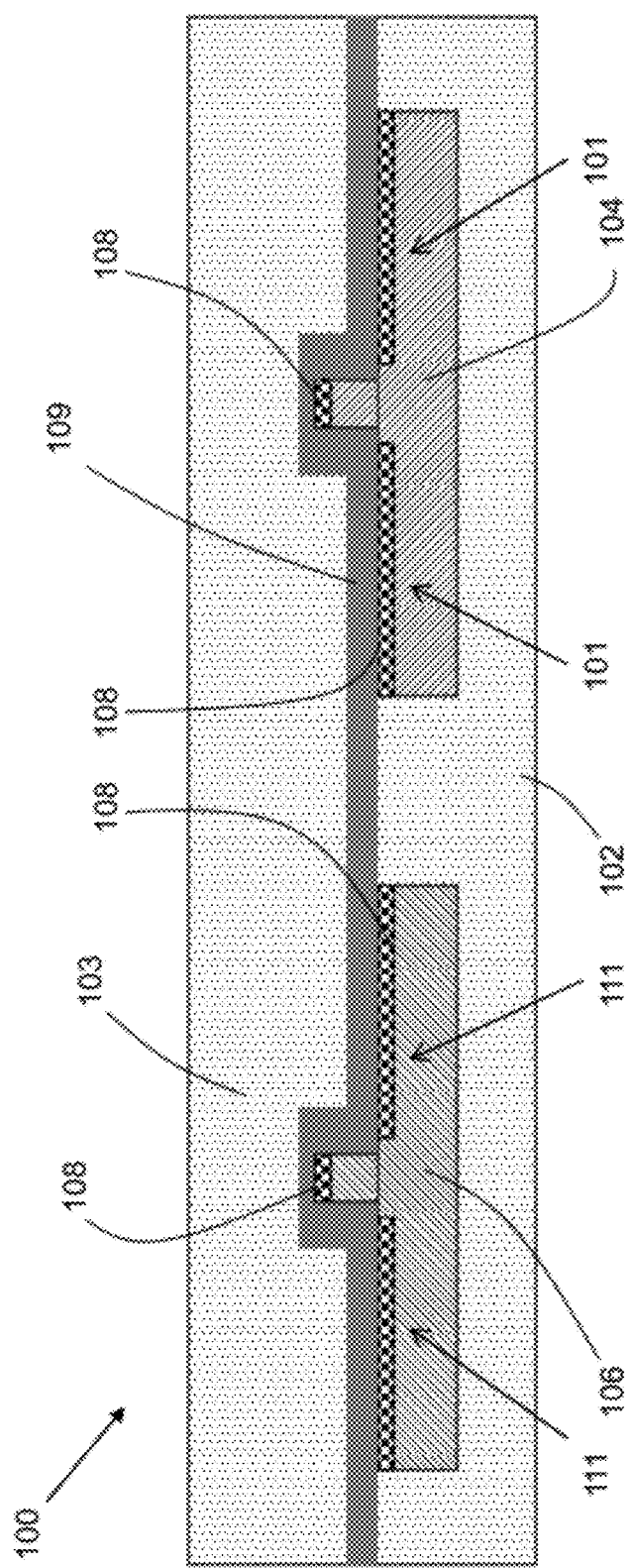

As shown in FIG. 3, at least one layer of nitride 109 is then deposited over substrate 102, including over PFET 104 and NFET 106. For ease of illustration, nitride layer(s) 109 is shown in the figures as a single layer of nitride 109, but it is well known that there may be additional or alternative nitride layers on PFET 104 and NFET 106. Nitride layer(s) 109 can be deposited to form a stress on FETs 104, 106; a tensile stress in the case of NFET 106 or a compressive stress in the case of PFET 104. This nitride layer(s) 109 can then be patterned and removed over the FET that nitride layer(s) 109 is not tailored to improve. As an example, a first nitride layer(s) 109 that imparts a compressive stress in the channel region of NFET 106 could be removed over NFET 106. An oppositely stressed second nitride layer(s) 109 can then be deposited to enhance the uncovered NFET 106. A second nitride layer(s) 109 can then be patterned and removed over the area covered by the first nitride layer(s) 109. The thickness of nitride layer(s) 109 can range from, for example, 50 Angstroms to 3,000 Angstroms.

As also shown in FIG. 3, a thick dielectric layer 103 is deposited over nitride layer(s) 109, and then polished to a flat surface. The dielectric is typically an oxide and can range in thickness from, for example, approximately 200 Angstroms to approximately 20,000 Angstroms, however it is understood that other interlayer dielectrics can also be employed.

Figure 4:
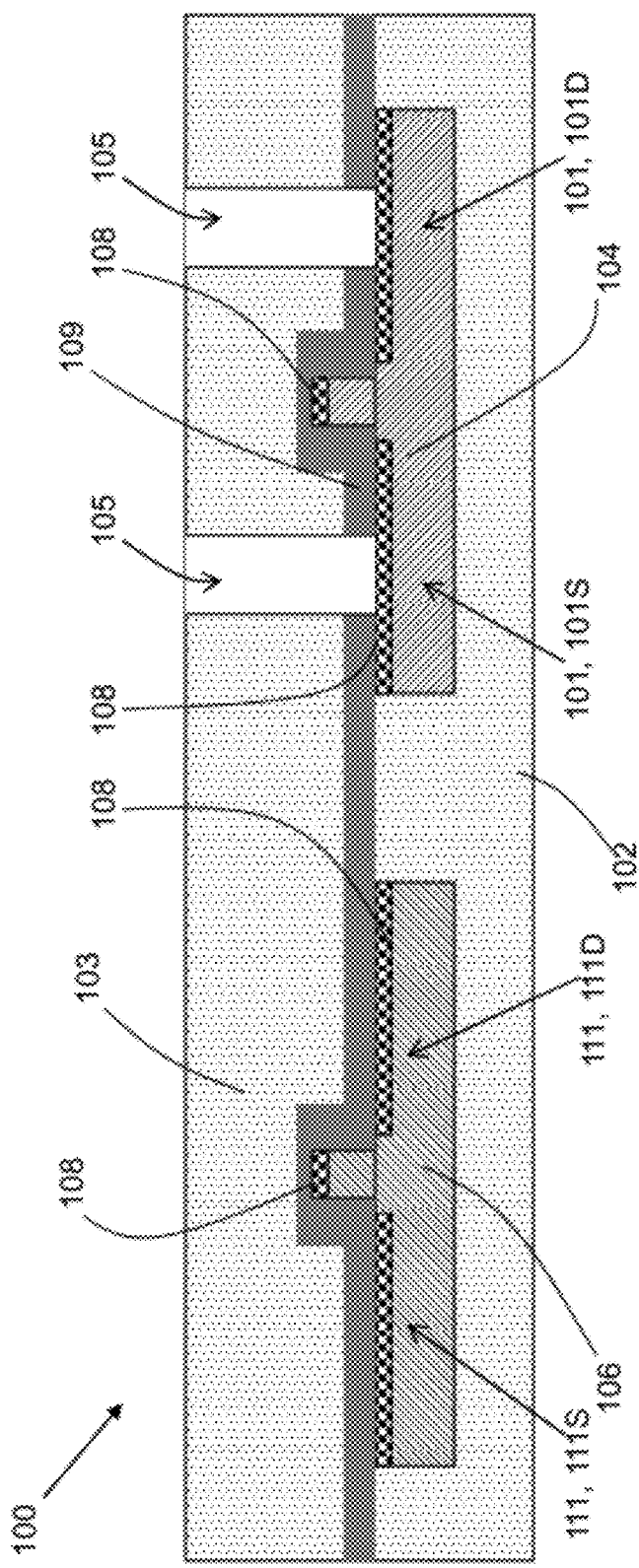

As shown in FIG. 4, at least one PFET contact trench 105 is etched to source/drain regions 101 of PFET 104, through dielectric layer 103, down to nitride layer(s) 109 on PFET 104. It is noted that in this embodiment, contact trench(es) 105 are preferably only etched such that nitride layer(s) 109 is opened, i.e., trench(es) 105 are not desired to be further etched through silicide layer 108 or into PFET 104, but some further etching beyond a surface of silicide layer 108 may take place. In one embodiment, a pair of PFET contact trenches 105 are etched, one PFET contact trench 105 to a source region 101S of PFET 104 and one PFET contact trench 104 to a drain region 101D of PFET 104. Trench(es) 105 can be formed by traditional masking/etching steps, e.g., depositing and patterning a mask and etching trench(es) 105. While FIG. 4 shows two PFET contact trenches 105, it is understood that more or less trench(es) 105, positioned differently with respect to PFET 104, can be etched in keeping with embodiments of this invention.

Next, as shown in FIG. 5, PFET contact trenches 105 are lined, filled and then polished and/or etched to remove any residual fill material away to form PFET contacts 112. The specific materials and deposition conditions used to form PFET contacts 112 will be discussed in more detail herein.

After PFET contacts 112 are formed, at least one NFET contact trench 107 is etched to source/drain regions 111 of NFET 106, through dielectric layer 103, down to nitride layer(s) 109 on NFET 106, as shown in FIG. 6. It is noted that contact trench(es) 107 are preferably only etched such that nitride layer(s) 109 is opened, i.e., trench(es) 107 are not desired to be further etched through silicide layer 108 or into NFET 106, but some further etching beyond a surface of silicide layer 108 may take place. In one embodiment, a pair of NFET contact trenches 107 are etched, one NFET contact trench 107 to a source region 111S of NFET 106 and one NFET contact trench 107 to a drain region 111D of NFET 106. Trench(es) 107 can be formed by traditional masking/etching steps, e.g., depositing and patterning a mask and etching trench(es) 107. While FIG. 6 shows two NFET contact trenches 107, it is understood that more or less trench(es) 107, positioned differently with respect to NFET 106, can be etched in keeping with embodiments of this invention.

Next, as shown in FIG. 7, NFET contact trenches 107 are lined, filled and then polished and/or etched to remove any residual fill material away to form NFET contacts 114. The specific materials and deposition conditions used to form NFET contacts 114 will be discussed in more detail herein.

It is understood that while FIGS. 4-7 show PFET contacts 112 being formed first and then NFET contacts 114 being formed, the reverse is also disclosed. In other words, NFET contact trenches 107 can be etched, filled and polished to form NFET contacts 114, and then PFET contact trenches 105 can be etched, filled and polished to form PFET contacts 112.

Generally, contacts 112, 114 are lined and filled as known in the art, for example, by depositing a titanium or titanium nitride liner and then filling with a fill material using chemical vapor deposition (CVD), then polishing the surface to remove any excess material. As discussed herein, the specific deposition conditions and fill materials used can be varied according to embodiments of this invention to create differential stress in PFET contacts 112 and NFET contacts 114.

First, as discussed herein, in order to vary the deposition conditions, PFET contacts 112 are patterned independently from NFET contacts 114, i.e., PFET contacts 112 can be created first, and then NFET contacts 114, or vice versa. An example of PFET contacts 112 being formed first is shown in FIGS. 1-7, but it is understood that NFET contacts 114 can be formed prior to PFET contacts 112.

In one embodiment, differential stresses on PFET 104 and NFET 106 can be created by varying the deposition conditions (structural or chemical) of contacts 112, 114. In a first example, tungsten (W) can be used for both PFET contacts 112 and NFET contacts 114, but the temperature stress that the tungsten (W) imparts is varied with respect to the two sets of contacts 112, 114. For example, tungsten (W) can be deposited at a temperature in the range of approximately 400 C to approximately 600 C for PFET contacts 112, while tungsten (W) can be deposited at a lower temperature for NFET contacts 114, e.g., in the range of approximately 200 C to approximately 400 C. Varying the temperature between contacts 112, 114 will create different thermal expansion in PFET contacts 112 than in NFET contacts 114, which will in turn create differential stress on PFET 104 and NFET 106. In other words, the higher temperature used to form PFET contacts 112 will result in a high tensile stress in the tungsten (W) material, which will impart a compressive stress on the silicon in PFET 104. The lower temperature used to form NFET contacts 114 will result in less tensile stress in the tungsten (W) material, and therefore imparting a lesser compressive stress on the silicon in NFET 106, as compared to the compressive stress imparted on PFET 104.

In another embodiment, the deposition rate, i.e., the rate at which the fill material, such as tungsten, is deposited to form contacts 112, 114, can also be varied in order to create differential stresses imparted on PFET 104 and NFET 106. According to this embodiment, regardless of the specific rate used, the rates are varied between PFET 104 and NFET 106, e.g., a higher rate can be used to deposit the fill material for PFET 104 and a lower deposition rate can be used to deposit the fill material for NFET 106. The higher the deposition rate, the more tensile the fill material will be, and therefore, the more compressive stress will be imparted on the device. Therefore, using a higher deposition rate for forming contacts 112 to PFET 104 than for forming contacts 114 to NFET 106 will result in a higher compressive stress imparted on PFET 104 than on NFET 106.

In another embodiment, different materials, with different coefficients of thermal expansions (CTEs), can be used in any part of PFET contacts 112 and NFET contacts 114 to create a differential stress. For example, a fill material having a higher CTE can be used to form PFET contacts 112 than the fill material used to form NFET contacts 114. In one example, titanium nitride (TiN) or titanium nitride plus copper (TiNCu) can be used to form PFET contacts 112, and a polysilicon or tungsten (W) can be used to form NFET contacts 114, because polysilicon and tungsten have relatively lower CTEs than copper and titanium nitride. The higher the CTE, the more tensile the fill material and therefore the higher the compressive stress imparted on the device. In other words, using a material with a higher CTE for PFET contacts 112 than for NFET contacts 114 will result in PFET contacts 112 being more tensile than NFET contacts 114, and therefore, PFET contacts 112 will impart more compressive stress on PFET 104 than NFET contacts 114 will impart on NFET 106.

FIG. 7 shows IC chip 100 according to an embodiment of this invention, including differential stress on devices PFET 104 and NFET 106. IC chip 100 includes substrate 102 having a PFET 104 and an NFET 106 thereon, with at least one PFET contact 112 to source/drain region 101 of PFET 104 and at least one NFET contact 114 to source/drain region 111 of NFET 106. IC chip 100 results in differential stresses imparted on NFET 106 and PFET 104 due to the varying deposition conditions performed during formation of PFET contacts 112 and NFET contacts 114.

Turning to FIGS. 8-13, in another embodiment, NFET contacts 114 can differ from PFET contacts 112 in that a silicon and metal reaction can be created in either at least one PFET contact 112 (FIGS. 8 and 9), or at least one NFET contact 114 (FIGS. 10 and 11), or in at least one PFET contact 112 and at least one NFET contact 114 (FIGS. 12 and 13) to form a silicide. Silicide formation typically requires depositing a metal such as nickel (Ni), cobalt (Co), palladium (Pd), platinum (Pt), rhodium (Rh), iridium (Ir), yttrium (Y), zirconium (Zr), vanadium (V), chromium (Cr), hafnium (Hf), erbium (Er), molybdenum (Mo) or titanium (Ti) onto a surface of a silicon (Si) containing material or wafer, i.e., PFET 104 or NFET 106. Following deposition, the structure is then subjected to an annealing step using conventional processes such as, but not limited to, rapid thermal annealing. During thermal annealing, the deposited metal reacts with the silicon to form a silicide. The type of metal that is used to react with the silicon depends on which device the contact is adjacent to, i.e., PFET 104 or NFET 106. If a compressive stress is desired, i.e., for PFET 104, the silicide metal may be zirconium (Zr), platinum (Pt), palladium (Pd), rhodium (Rh) or yttrium (Y) or other metals or alloys that produce a ratio of silicide volume to silicon consumed that produce a compressive stress. If a tensile stress is desired, i.e., for NFET 106, the silicide metal may be a silicide produced from nickel (Ni), cobalt (Co), erbium (Er), vanadium (V), zirconium (Zr), chromium (Cr), hafnium (Hf), or molybdenum (Mo) or other metals or alloys that produce a ratio of silicide volume to silicon consumed that produce a stress that is more tensile than the stress produced by the silicide in PFET contacts 112.

Figure 8:
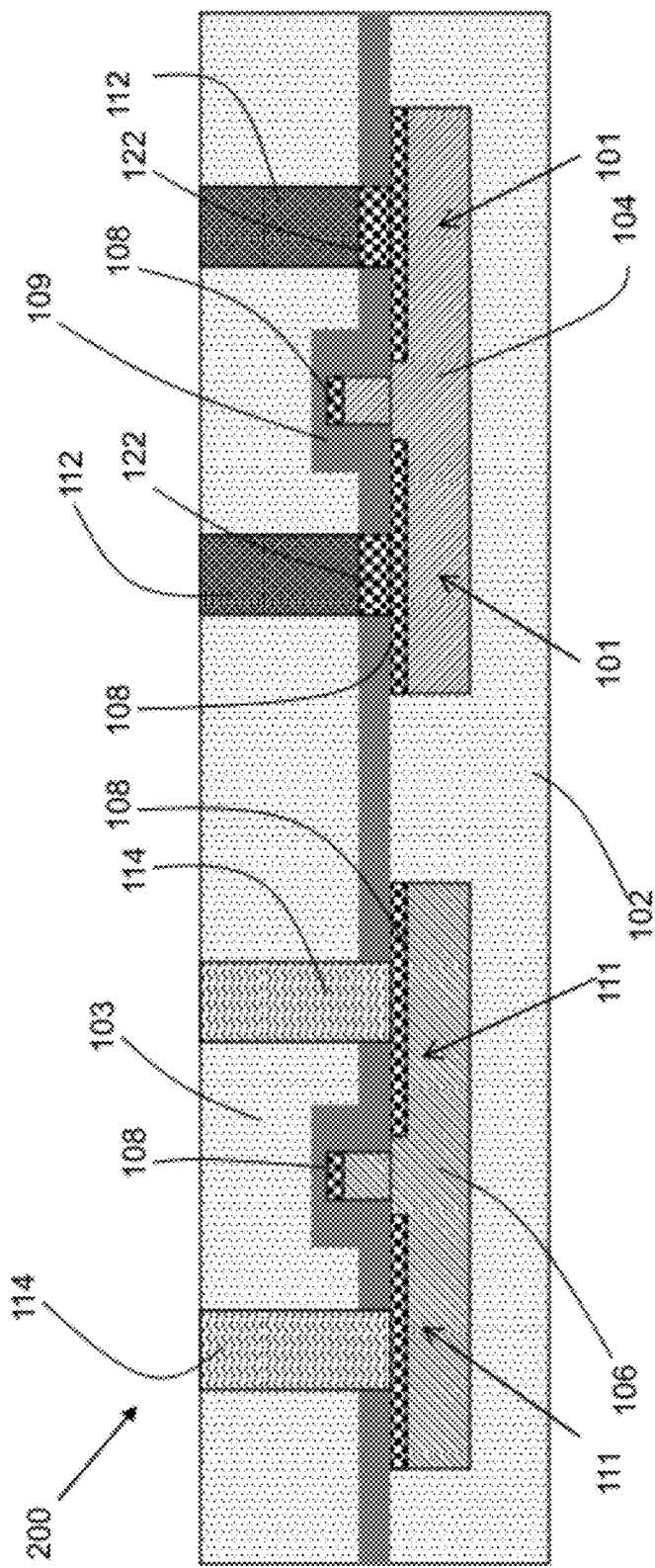
FIGS. 8-13 show an IC chip according to embodiments of this disclosure.
Figure 9:
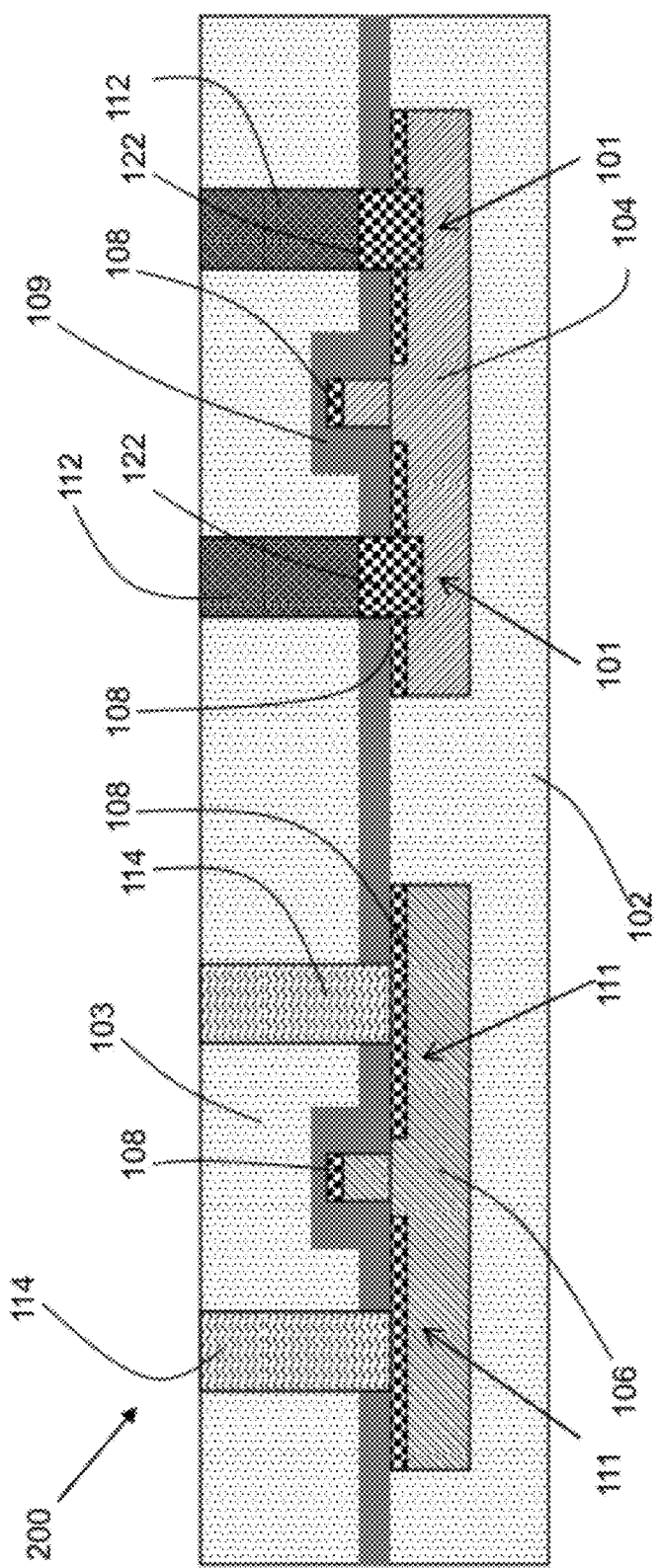

As shown in FIGS. 8 and 9, a silicide layer can be created within at least one PFET contact 112. Specifically, an additional step is performed after trenches 105 have been etched (FIG. 4) and before trenches 105 are filled, polished and/or etched to form PFET contacts 112 (FIG. 5). Specifically, this additional step includes depositing a metal, for example, zirconium (Zr), platinum (Pt), palladium (Pd), iridium (Ir), cobalt (Co), rhodium (Rh) or yttrium (Y) into trenches 105, without first depositing a traditional liner. A thermal anneal is then performed. During thermal annealing, the deposited metal reacts with the silicon in PFET 104 to form a metal silicide layer 122, i.e., PtSi, $Pt_2Si$, IrSi, $Pd_2Si$, $CoSi_2$, PdSi, RhSi, YSi, $Zr_2Si$. Any unreacted metal can then be removed, and a traditional liner, e.g., a thin layer of titanium nitride (TiN), and typical fill material, such as tungsten (W), can then be added to fill trenches 105 to form PFET contacts 112. The resulting structure, shown in FIGS. 8 and 9, includes a layer of silicide 122 within at least one PFET contact 112.

Regardless of the size of silicide layer 122, the silicide will result in a tensile material in PFET contact 114, which will in turn cause a compressive stress to be imparted on PFET 104. As is known in the art, it is desirable to have a compressive stress imparted on a p-doped FET, such as PFET 104. The larger the silicide layer 122, the larger the compressive stress imparted on PFET 104.

Figure 10:
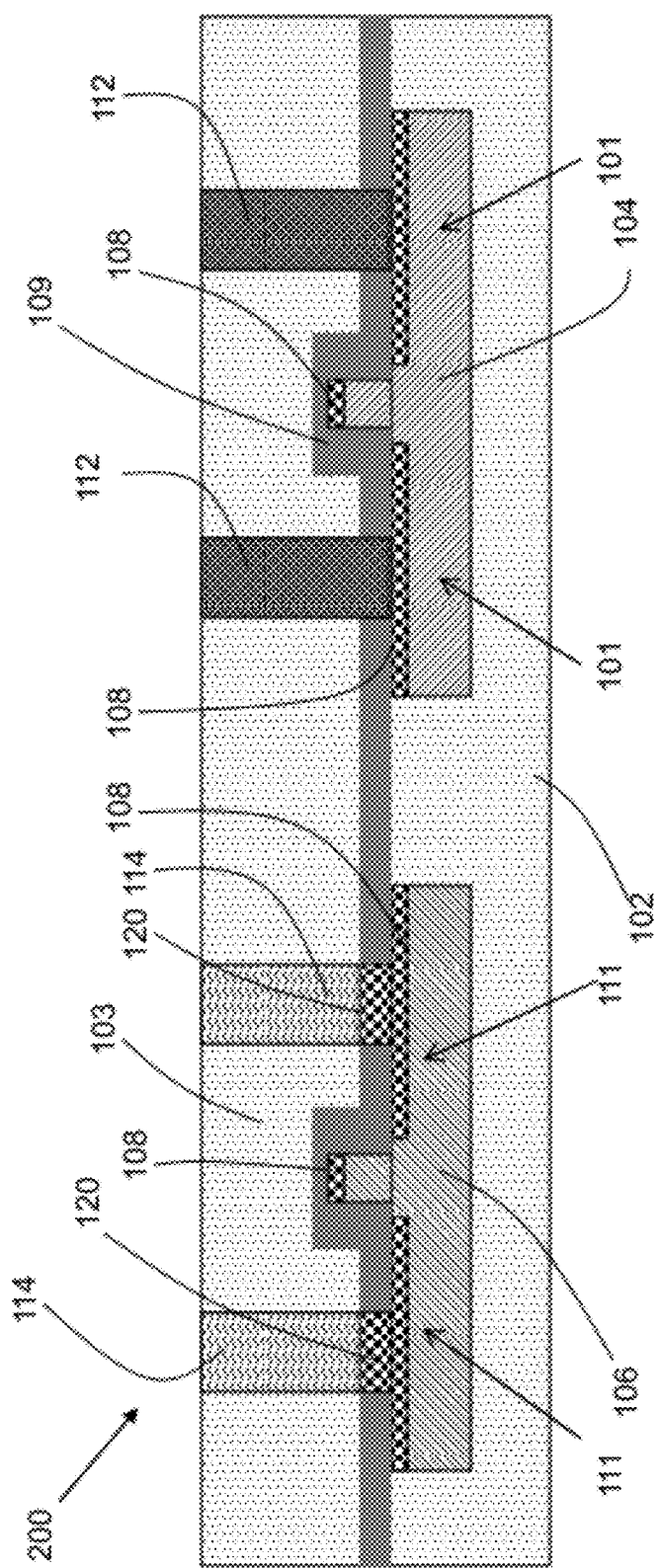
Figure 11:
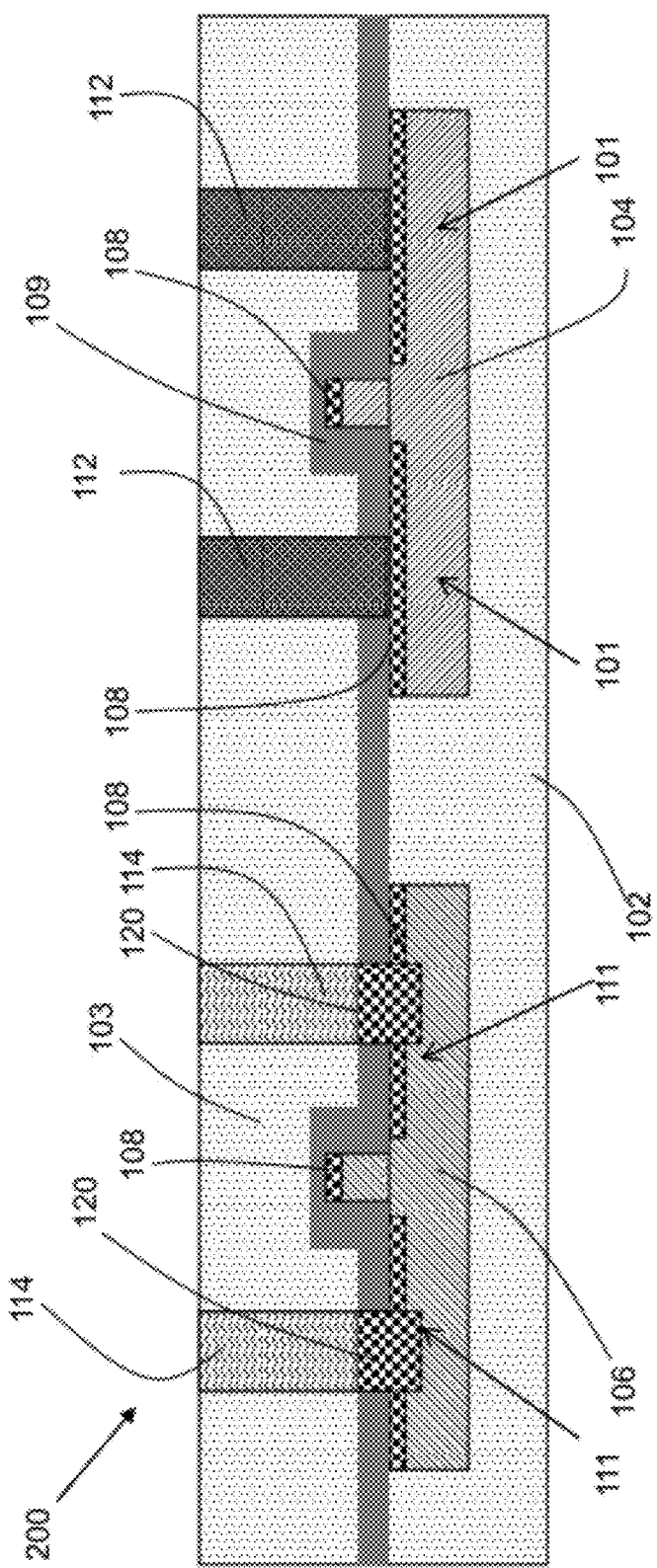

A similar process can be performed to form the structure shown in FIGS. 10 and 11, with a layer of silicide 120 within at least one NFET contact 114. Specifically, an additional step is performed after trenches 107 have been etched (FIG. 6) and before contact trenches 107 are filled, polished and/or etched to form PFET contacts 112 (FIG. 7). Specifically, this additional step includes depositing a metal, for example, nickel (Ni), cobalt (Co), erbium (Er), vanadium (V), zirconium (Zr), chromium (Cr), hafnium (Hf), or molybdenum (Mo) into trenches 107, without first depositing a traditional liner. A thermal anneal is then performed. During thermal annealing, the deposited metal reacts with the silicon in NFET 106 to form a metal silicide layer 120, i.e., $CoS_{i2}$, $VS_{i2}$, ErSi, $ZrS_{i2}$, HfSi, $MoS_{i2}$, NiSi, or $CrS_{i2}$. Any unreacted metal can then be removed, and a traditional liner, e.g., a thin layer of titanium nitride (TiN), and typical fill material, such as tungsten (W), can then be added to fill trenches 107 to form NFET contacts 114. The annealing and cleaning details will be optimized by those skilled in the art for each type of silicide. In one example, for $CoS_{i2}$, the first anneal is completed at a temperature ranging from about 350 C to about 600 C for a time period ranging from about 1 second to about 90 seconds. The resulting structure, shown in FIGS. 9 and 10, includes a layer of silicide 120 within at least one NFET contact 114.

Regardless of the size of silicide layer 120, the silicide will result in a compressive material in NFET contact 112, which will in turn cause a tensile stress to be imparted on NFET 106. As is known in the art, it is desirable to have a tensile stress imparted on an n-doped FET, such as NFET 106. The larger the silicide layer 120, the larger the tensile stress imparted on NFET 106.

Figure 12:
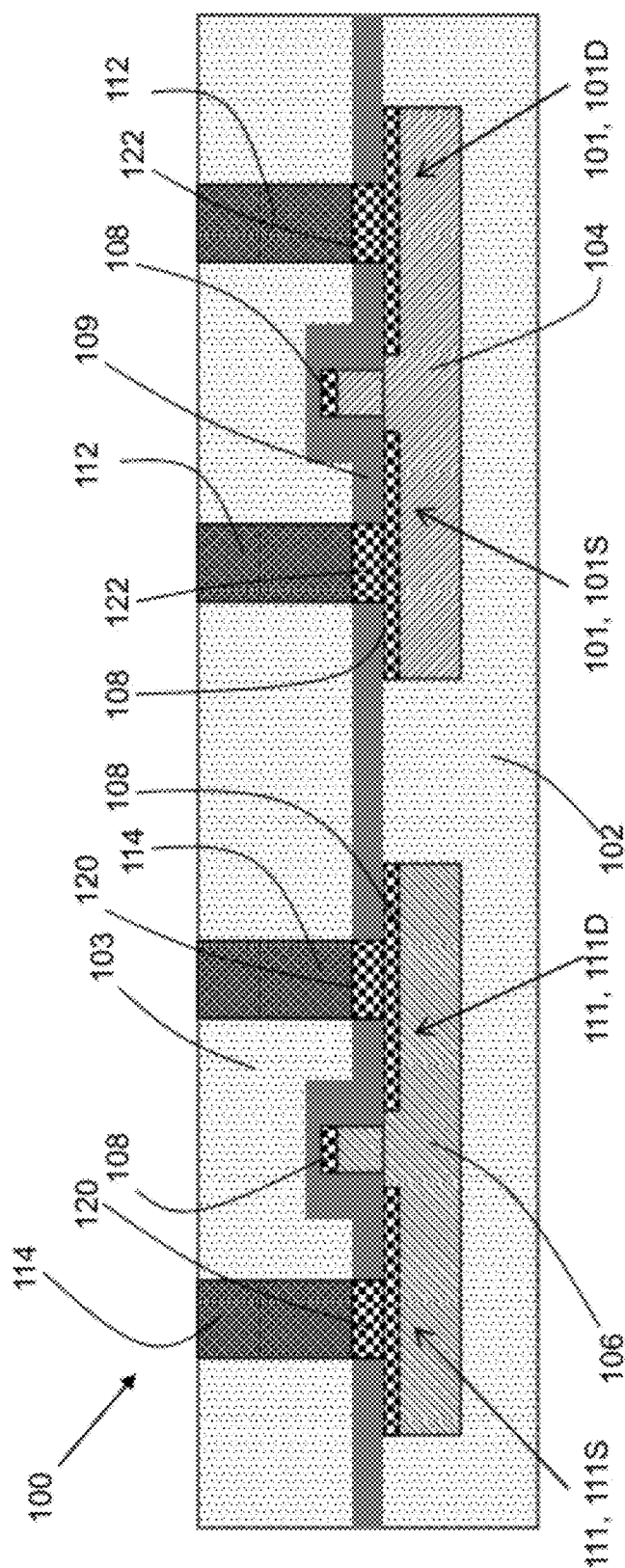
Figure 13:
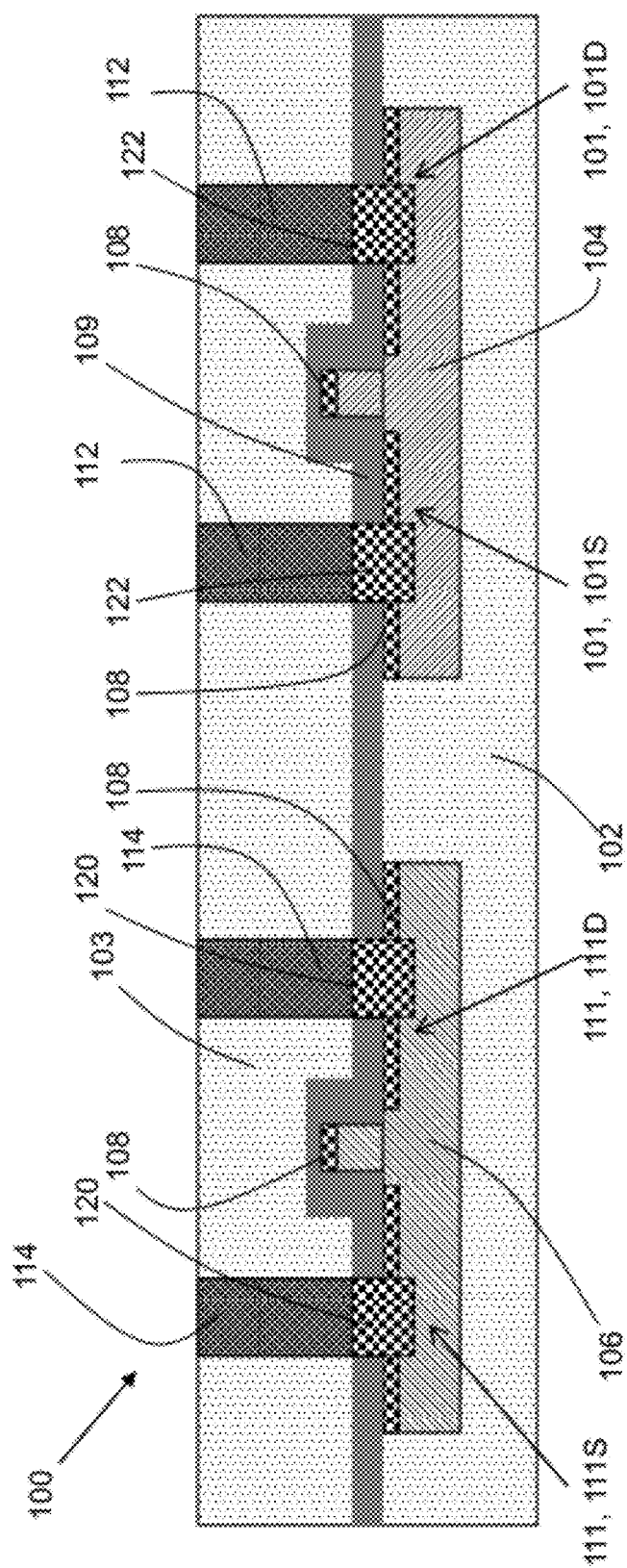

It is also understood that while FIGS. 8 and 9 show a silicide layer 122 in PFET contacts 112, with no silicide layer formed in NFET contacts 114, and FIGS. 10 and 11 show a silicide layer 120 in NFET contacts 114 with no silicide layer formed in PFET contacts 112, these two embodiments can also be combined. In other words, as shown in FIGS. 12 and 13, a substrate including NFET 106 and PFET 104, can include PFET contacts 112 having silicide layers 120, and NFET contacts 114 having silicide layers 122. Embodiments of this invention are directed to creating differential stress in PFET 104 as compared to NFET 106, therefore any combination of different silicide layers within NFET 106 and PFET 104 can be employed. IC chip 200 results in differential stresses imparted on NFET 106 and PFET 104 due to the silicide layer included between at least one NFET contact 114 and NFET 106, and/or between at least one PFET contact 112 and PFET 104.

In another embodiment, silicide layers 120, 122 can protrude into silicide layer 108, and/or into the device. For example, as shown in FIG. 9, silicide layer 122 can protrude into PFET 104, or silicide layer 120 can protrude into NFET 106, as shown in FIG. 11. This can be accomplished by etching trenches 105, 107 (FIGS. 4 and 6) further, i.e., through silicide layer 108 and further into NFET 106 or PFET 104. Once the metal was deposited, and heated, the resulting silicide layers 120, 122 would protrude into the source/drain regions 101, 111 of their respective devices (either NFET 106 or PFET 104), as shown in FIGS. 9 and 11. It is also understood that in one embodiment, both silicide layers 120, 122 protrude into their respective devices, as shown in FIG. 13.

It is also noted that the formation of the silicide layers discussed herein can be accomplished in any process order desired. For example, similar to the processes discussed in connection with FIGS. 1-6, PFET contacts 112 including a silicide layer 122 can be formed first, then NFET contacts 114 including a silicide layer 120, or vice versa. For example, first, a trench 105 for a PFET contact 112 can be etched down to PFET 104, then a metal can be deposited, an anneal performed, then a wet clean process to remove the remaining metal. Then, PFET contact 112 can be formed as discussed herein, i.e., by depositing a liner, filling with the desired fill material, and polishing. After PFET contact 112 has been formed, a trench 107 for an NFET contact 114 can be etched down to NFET 106, then a metal can be deposited, an anneal performed, then a wet clean process to remove the remaining metal. Then NFET contact 114 can be formed as discussed herein, i.e. by depositing a liner, filling with the desired fill material, and polishing.

Figure 14:
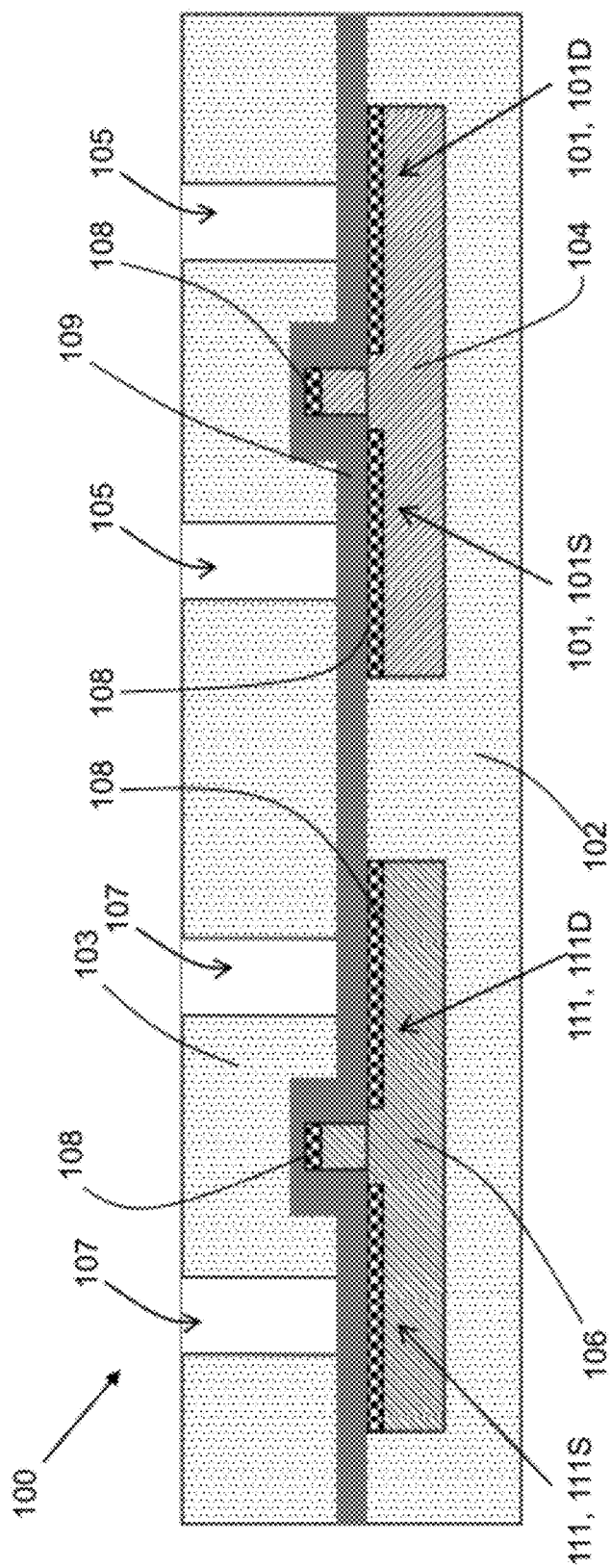
FIGS. 14-18 show steps of a method to form an IC chip according to embodiments of this disclosure, with FIG. 18 showing an IC chip according to an embodiment.
Figure 15:
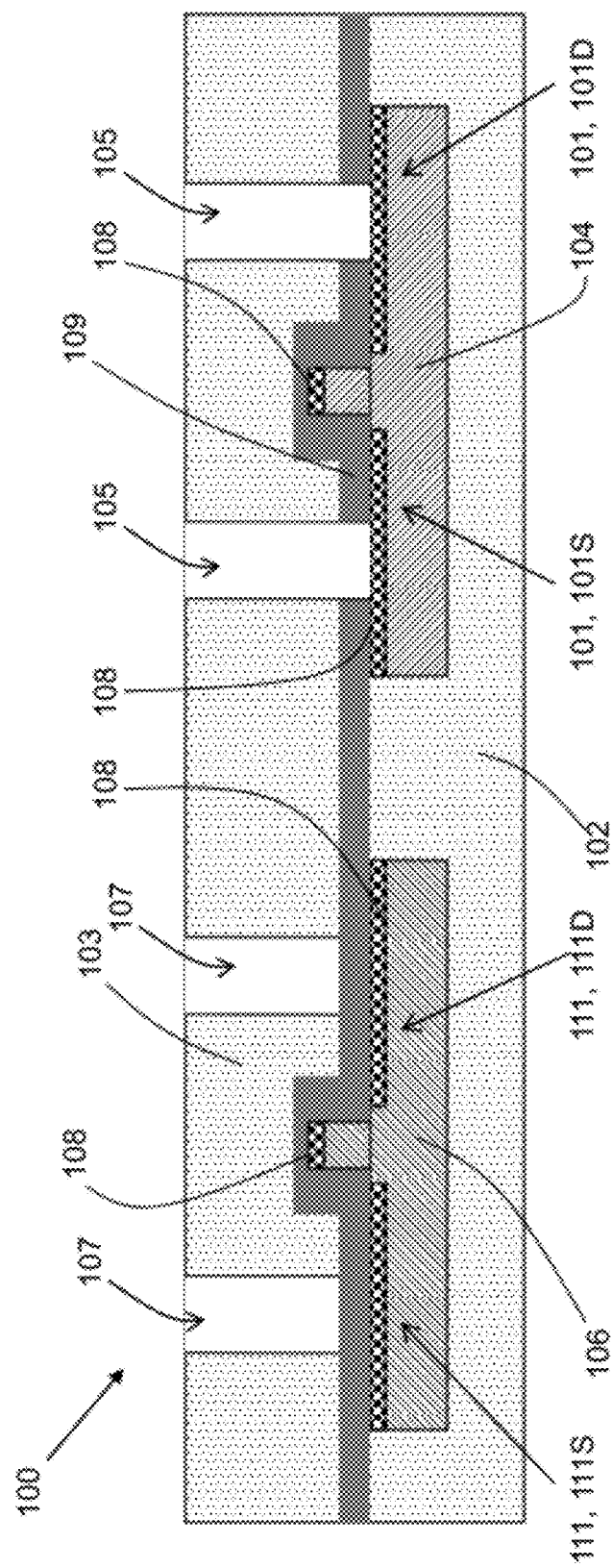
Figure 16:
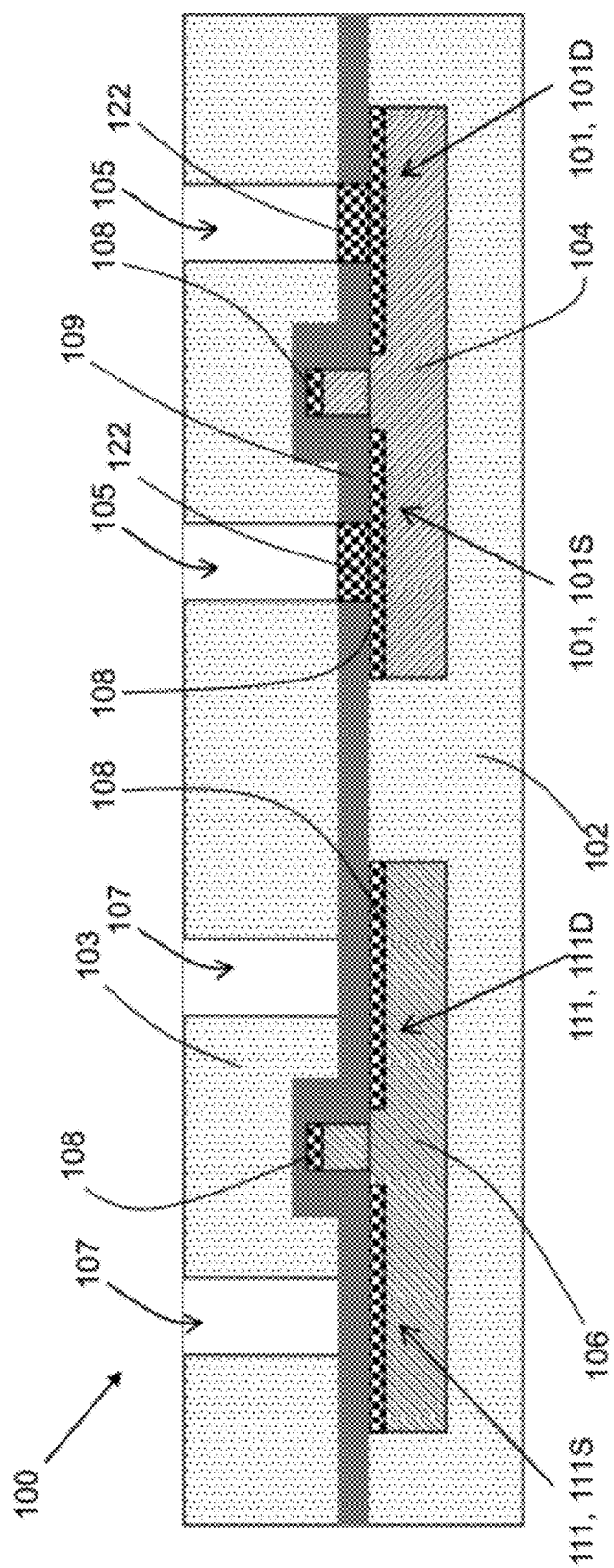
Figure 17:
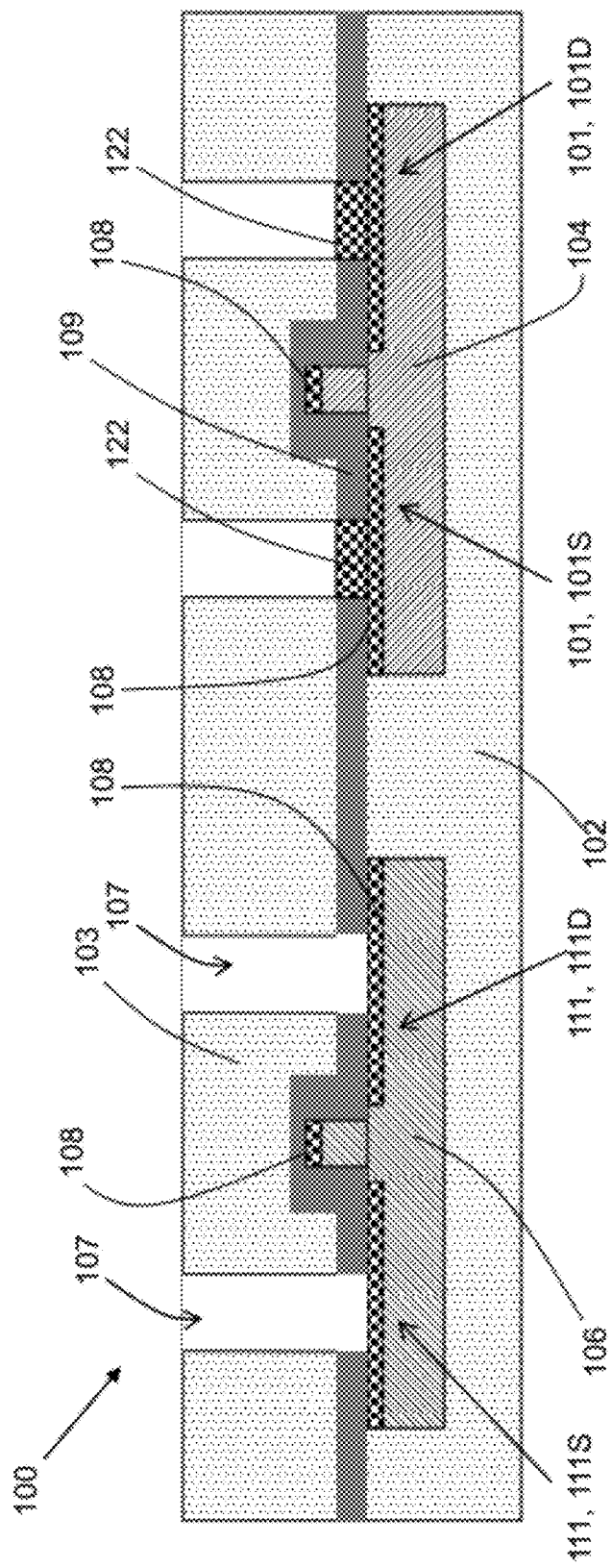
Figure 18:
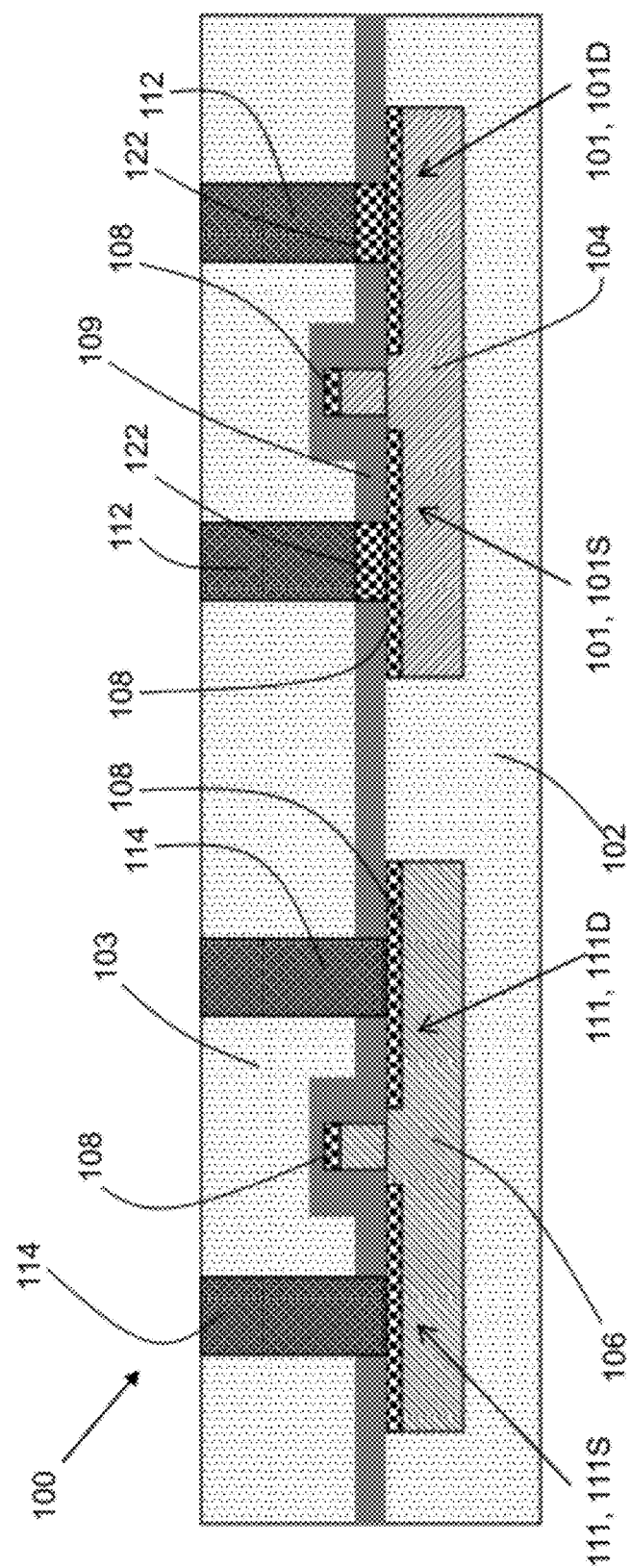

In the alternative, in an embodiment shown in FIGS. 14-18, trenches 105, 107 to both PFET 104 and NFET 106 can be etched at the same time. However, in this method, as shown in FIG. 14, trenches 105, 107 would only be etched, simultaneously, down to nitride layer(s) 109. Then, as shown in FIG. 15, nitride layer(s) 109 can be opened in trenches 105 only, not trenches 107, i.e., by further etching trenches 105. Then, as shown in FIG. 16, the metal can be deposited within trenches 105, then heated, to form silicide layer 122, and then any unreacted metal is removed. Then, as shown in FIG. 17, NFET contact trenches 107 can be etched of nitride, i.e., nitride layer(s) 109 in trenches 107 can be opened. Then, as shown in FIG. 18, all the contacts (i.e., NFET contacts 114 and PFET contacts 112) can be formed with a standard process, such as, depositing a liner, filling and polishing, as discussed in more detail herein. It is also noted that this process can be adjusted to form a silicide layer 120 in NFET contacts 114, by opening nitride layer(s) 109 in trenches 107 first, depositing the metal, then heating to form silicide layer 120, and then any unreacted metal is removed. Then nitride layer(s) 109 in trenches 105 can be opened, and both sets of contacts 112, 114 can be formed with a standard process.

The embodiments discussed herein can also be combined together such that any combination of different materials, deposited at different temperatures and at different rates, can be used for PFET contacts 112 and NFET contacts 114. Essentially, higher temperatures, faster deposition rates and materials with high CTEs are used to create more compressive stress in a device, while lower temperatures, lower deposition rates, and materials with lower CTEs are used to create less compressive stress in a device. Again, specific ranges of temperatures, deposition rates or CTEs are not as important as the differential between the ranges used for NFETs and PFETs. In other words, higher temperatures, faster deposition rates and materials with higher CTEs are used to form PFET contacts 112, while lower temperatures, lower deposition rates and materials with lower CTEs are used to form NFET contacts 114. In addition, the inclusion of a silicide layer within at least one NFET contact 114 and/or within at least one PFET contact 112 can also be included with any of the embodiments discussed herein to further differentiate the stresses imparted on NFET 106 from those imparted on PFET 104.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of creating differential stress in a plurality of contacts in an integrated circuit (IC) chip, the method comprising:
    providing a substrate including a p-type field effect transistor (PFET) and an n-type field effect transistor (NFET);
    etching at least one PFET contact trench to the PFET;
    depositing a first material at a first temperature in the at least one PFET contact trench to form a PFET metal contact within the PFET contact trench;
    etching at least one NFET contact trench to the NFET; and
    depositing a second material at a second temperature in the at least one NFET contact trench to form an NFET metal contact within the NFET contact trench,
    wherein the first temperature of the first material forming the PFET metal contact is higher than the second temperature of the second material forming the NFET metal contact.

2. The method of claim 1, wherein the first material has a first coefficient of thermal expansion (CTE) and the second material has a second CTE, and wherein the first CTE is higher than the than the second CTE.

3. The method of claim 1, wherein a rate at which the first material is deposited is faster than a rate at which the second material is deposited.

4. The method of claim 1, wherein the first material is tungsten.

5. The method of claim 1, wherein the first temperature is in the range of approximately 400 C to approximately 600 C.

6. The method of claim 1, wherein the second material is selected from the group consisting of: copper and tungsten.

7. The method of claim 1, wherein the second temperature is in the range of approximately 200 C to approximately 400 C.

8. A method of creating differential stress in a plurality of contacts in an integrated circuit (IC) chip, the method comprising:
    providing a substrate including a p-type field effect transistor (PFET) and an n-type field effect transistor (NFET);
    etching at least one PFET contact trench to the PFET;
    depositing a first material at a first temperature in the at least one PFET contact trench to form a PFET contact;
    etching at least one NFET contact trench to the NFET; and
    depositing a second material at a second temperature in the at least one NFET contact trench to form an NFET contact,
    wherein the first temperature of the first material forming the PFET contact is higher than the second temperature of the second material forming the NFET contact, wherein the first material is compositionally distinct from the second material, and wherein a rate at which the first material is deposited is faster than a rate at which the second material is deposited.

9. The method of claim 8, wherein the first material has a first coefficient of thermal expansion (CTE) and the second material has a second CTE, and wherein the first CTE is higher than the than the second CTE.

10. The method of claim 8, wherein the first material is selected from the group consisting of: a polysilicon and tungsten.

11. The method of claim 8, wherein the first temperature is in the range of approximately 400 C to approximately 600 C.

12. The method of claim 8, wherein the second material is selected from the group consisting of: copper, titanium nitride and tungsten.

13. The method of claim 8, wherein the second temperature is in the range of approximately 200 C to approximately 400 C.

14. A method of creating differential stress in a plurality of contacts in an integrated circuit (IC) chip, the method comprising:
    providing a substrate including a p-type field effect transistor (PFET) and an n-type field effect transistor (NFET);
    etching at least one PFET contact trench to the PFET;
    depositing a first material at a first temperature only in the at least one PFET contact trench to form a PFET contact;
    etching at least one NFET contact trench to the NFET; and
    depositing a second material at a second temperature only in the at least one NFET contact trench to form an NFET contact,
    wherein the first temperature of the first material forming the PFET contact is higher than the second temperature of the second material forming the NFET contact, and wherein a rate at which the first material is deposited is faster than a rate at which the second material is deposited.

15. The method of claim 14, wherein the first material is selected from the group consisting of: a polysilicon and tungsten.

16. The method of claim 14, wherein the first temperature is in the range of approximately 400 C to approximately 600 C.

17. The method of claim 14, wherein the second material is selected from the group consisting of: copper, titanium nitride and tungsten.

18. The method of claim 14, wherein the second temperature is in the range of approximately 200 C to approximately 400 C.

* * * * *